(12) United States Patent
Hansen

(10) Patent No.: US 11,811,220 B2
(45) Date of Patent: *Nov. 7, 2023

(54) SOFT STARTER FOR HIGH-CURRENT ELECTRIC DEVICES

(71) Applicant: Raymond Innovations, LLC, Rapid City, SD (US)

(72) Inventor: Will Hansen, Rapid City, SD (US)

(73) Assignee: RAYMOND INNOVATIONS, LLC, Rapid City, SD (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/863,166

(22) Filed: Jul. 12, 2022

(65) Prior Publication Data

US 2022/0352708 A1    Nov. 3, 2022

Related U.S. Application Data

(63) Continuation of application No. 16/802,414, filed on Feb. 26, 2020, now Pat. No. 11,394,198.

(60) Provisional application No. 62/810,735, filed on Feb. 26, 2019.

(51) Int. Cl.
| | | |
|---|---|---|
| *H02H 9/00* | (2006.01) | |
| *H02H 9/02* | (2006.01) | |
| *H05K 1/18* | (2006.01) | |
| *H02H 1/00* | (2006.01) | |
| *G01R 15/20* | (2006.01) | |
| *H01C 7/00* | (2006.01) | |

(52) U.S. Cl.
CPC ............. *H02H 9/02* (2013.01); *G01R 15/202* (2013.01); *H01C 7/008* (2013.01); *H02H 1/0007* (2013.01); *H05K 1/181* (2013.01); *H05K 2201/10022* (2013.01); *H05K 2201/10151* (2013.01)

(58) Field of Classification Search
None
See application file for complete search history.

(56) References Cited

U.S. PATENT DOCUMENTS

| | | |
|---|---|---|
| 3,670,811 A | 6/1972 | Christensen |
| 5,610,571 A | 3/1997 | Kuzuoka |
| 6,161,389 A | 12/2000 | Sekiya et al. |
| 6,948,909 B2 | 9/2005 | Meshenky et al. |
| 7,059,769 B1 | 6/2006 | Potega |
| 8,519,662 B2 | 8/2013 | Lu et al. |
| 9,383,093 B2 | 7/2016 | Tilmont et al. |
| 10,383,253 B1 | 8/2019 | Mujcinovic |

(Continued)

*Primary Examiner* — Stephen W Jackson

(74) *Attorney, Agent, or Firm* — Goodhue, Coleman & Owens, P.C.

(57) ABSTRACT

An inrush current limiting circuit in aspects of the present disclosure may have one or more of the following features: a printed circuit board, an electrical input disposed on the circuit board, one or more electrical outputs disposed on the circuit board, a current limiting circuit connected between the electrical input and the one or more electrical outputs, at least one microcontroller connected within the current limiting circuit, at least one current sensor connected within the current limiting circuit, one or more current limiting components within the current limiting circuit for increasing voltage and current over time from the electrical input to the one or more electrical outputs by operation of the current sensor and the microcontroller.

20 Claims, 13 Drawing Sheets

(56) References Cited

U.S. PATENT DOCUMENTS

| | | |
|---|---|---|
| 10,580,554 B1 | 3/2020 | Hansen |
| 11,394,198 B2 * | 7/2022 | Hansen .................. H01C 7/008 |
| 2007/0127310 A1 | 6/2007 | Metcalfe et al. |
| 2010/0163213 A1 | 7/2010 | Xu et al. |
| 2011/0095621 A1 | 4/2011 | Petersen |
| 2011/0198340 A1 | 8/2011 | Zimmer et al. |
| 2016/0302475 A1 | 10/2016 | Penrose et al. |
| 2021/0328390 A1 * | 10/2021 | Hansen .............. H01R 13/6658 |

* cited by examiner

SOFT STARTER FOR HIGH-CURRENT ELECTRIC DEVICES

PRIORITY STATEMENT

This application is a continuation of U.S. Non-Provisional patent application Ser. No. 16/802,414, filed on Feb. 26, 2020 which claims priority to U.S. Provisional Patent Application No. 62/810,735, filed on Feb. 26, 2019, both titled SOFT STARTER FOR HIGH-CURRENT ELECTRIC DEVICES all of which are hereby incorporated by reference in their entirety.

FIELD OF THE INVENTION

The present disclosure relates to initial start-up of electric devices. Particularly, the present disclosure relates to an apparatus for controlling the inrush of current to one or more electric devices. More particularly, but not exclusively, the present disclosure relates to an apparatus and method for controlling the inrush of current to electric devices, such as high-current devices, through current restriction.

BACKGROUND

AC motor driven devices, such as power tools, garage door openers, conveyors, etc. undergo a loud and hard startup from the sudden inrush of electrical current. This can cause an unsafe and unpleasant user experience. It can also cause dimming lights, tripped circuit breakers, as well as increased wear and tear to the motor driven devices, electric current carrying and exposed components, and their attachments.

From the above, it is therefore seen that there exists a need in the art to overcome the deficiencies and limitations for powering AC motor-driven devices.

SUMMARY

Therefore, it is a primary object, feature, or advantage of the present disclosure to improve over the state of the art.

According to at least on object of the present disclosure, an inrush current limiting circuit is disclosed. The inrush current limiting circuit can include, for example, a printed circuit board, an electrical input disposed on the circuit board, one or more electrical outputs disposed on the circuit board, a current limiting circuit connected between the electrical input and the one or more electrical outputs, at least one microcontroller connected within the current limiting circuit, at least one current sensor connected within the current limiting circuit, and one or more current limiting components within the current limiting circuit for increasing voltage and current over time from the electrical input to the one or more electrical outputs by operation of the current sensor and the microcontroller.

According to another object of the present disclosure, a method for limiting inrush current is disclosed. The method can include, by way of example, one or more steps, such as, providing a current limiting circuit having at least one microcontroller, at least one current sensor, and one or more current limiting components having a preset current level, configuring the one or more current limiting components to a reduced voltage and current potential by operation of the at least one microcontroller, detecting current draw with the at least one current sensor, and increasing current over time with the one or more current limiting components by operation of the microcontroller if the current exceeds the preset current level.

According to at least one other object of the present disclosure, a method for limiting inrush current may have one or more of the following steps: (a) providing a housing enclosure having an electrical input and an electrical output, where at least one thermistor is in series with the electrical input and electrical output and the at least one thermistor has a temperature switch coupled to the at least one thermistor and an axial cooling fan, (b) detecting an inrush of current cause by a high-current device being powered on, (c) dissipating the inrush current with the at least one thermistor, (d) detecting a temperature of the at least one thermistor, (e) powering on the axial fan based upon the detected temperature of the at least one thermistor, (f) determining if the temperature of the at least one thermistor is above a preset limit for the at least one thermistor, (g) powering off the axial fan if the sensed temperature of the at least one thermistor is below a preset limit for the at least one thermistor, (h) bypassing the at least one thermistor when the inrush current has subsided, and (i) determining elapsed time from the initiation of the inrush current.

An inrush current limiting circuit in aspects of the present disclosure may have one or more of the following features: (a) an electrical inlet, (b) an electrical outlet, (c) a microcontroller operably coupled to the zero-crossing detector, (d) a triac/scr circuit operably coupled to the microcontroller and the electrical outlet, (e) a current sensor operably coupled to the electrical inlet, (f) a housing enclosure housing the microcontroller and the triac/scr circuit, and (g) a zero-crossing detector operably coupled to the current sensor.

An inrush current limiting circuit in aspects of the present disclosure may have one or more of the following features: (a) a housing enclosure, (b) an electrical input located on the housing enclosure, (c) an electrical output located on the housing enclosure, (d) at least one thermistor is in series with the electrical input and electrical output, (e) a temperature sensor coupled to the at least one thermistor and an axial cooling fan, (f) at least one thermistor, where the temperature sensor detects a temperature of the at least one thermistor, (g) the axial fan electrically is powered on to cool the at least one thermistor when the temperature sensor detects the at least one thermistor is above a pre-determined temperature, (h) a bypass circuit electrically coupled to an electrical input and the at least one thermistor, (i) a microcontroller electrically coupled to the bypass circuit, (j) a current sensor electrically coupled with the microcontroller and the at least one thermistor, (k) a PCB board supporting the at least one thermistor and the temperature sensor, and (l) an enclosed housing having at least one exhaust port.

One or more of these and/or other objects, features, or advantages of the present disclosure will become apparent from the specification and claims that follow. No single aspect need provide every object, feature, or advantage. Different aspects may have different objects, features, or advantages. Therefore, the present disclosure is not to be limited to or by any objects, features, or advantages stated herein.

BRIEF DESCRIPTION OF THE DRAWINGS

Illustrated aspects of the disclosure are described in detail below with reference to the attached drawing figures, which are incorporated by reference herein.

Figure 1:
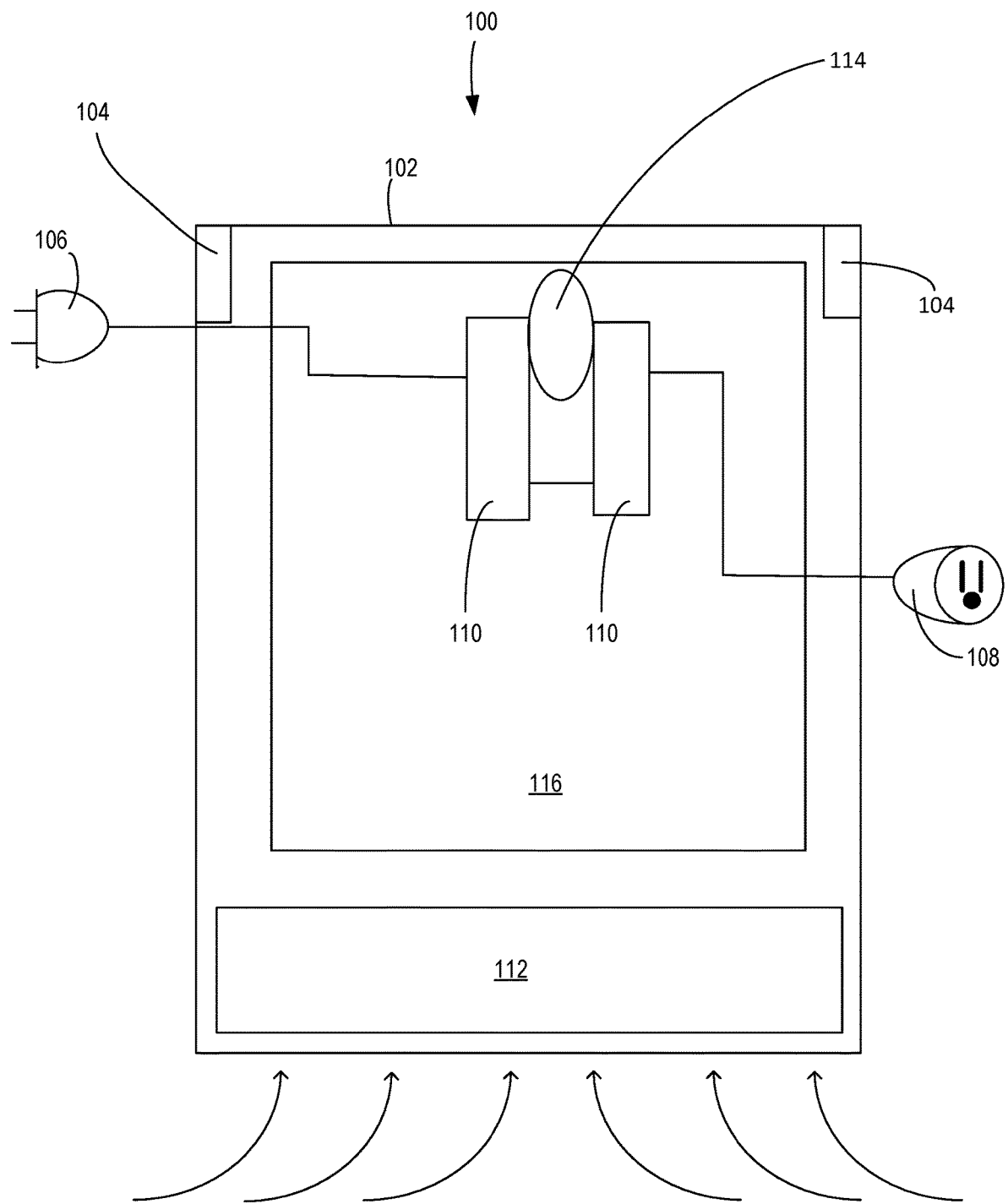
FIG. 1 is a pictorial representation of an inrush current limiting circuit in accordance with an aspect of the present disclosure.

Some of the figures include graphical and ornamental elements. It is to be understood the illustrative aspects contemplate all permutations and combinations of the various graphical elements set forth in the figures thereof.

DETAILED DESCRIPTION

The following discussion is presented to enable a person skilled in the art to make and use the present teachings. Various modifications to the illustrated aspects will be clear to those skilled in the art, and the generic principles herein may be applied to other aspects and applications without departing from the present teachings. Thus, the present teachings are not intended to be limited to aspects shown but are to be accorded the widest scope consistent with the principles and features disclosed herein. The following detailed description is to be read with reference to the figures, in which like elements in different figures have like reference numerals. The figures, which are not necessarily to scale, depict selected aspects and are not intended to limit the scope of the present teachings. Skilled artisans will recognize the examples provided herein have many useful alternatives and fall within the scope of the present teachings. While aspects of the present disclosure are discussed in terms of current limiting components, it is fully contemplated that aspects of the present disclosure could be used in most any current inrush application without departing from the spirit of the invention.

A typical "inrush current limiter," or ICL, limits inrush current by initially impeding it with a desired amount of resistance, such as 10 ohms of resistance, while at room temperature. When a high-current device powers up, this initial resistance and in turn current draw creates a lot of heat which causes the resistance of the ICL to drop over a 1-2 second period due to its negative temperature coefficient. Better said, as temperature increases the resistance decreases.

The "recovery time" for the ICL to cool back down to the original 10 ohms is typically between 60-240 seconds. This time period is too long when being used with high current electric devices. Accordingly, the present disclosure is intended to speed up the cooling process.

The present disclosure details a soft starter to gradually ramp up the current to an electrical device. The soft start function can be achieved a couple of ways. In a first aspect, a varying resistance (thermistor) can be placed in series between the high current electrical device and the incoming electricity supply. The current will be lowered upon initial powering up of the high current electrical device due to the resistance of the variable resistance thermistor. As the thermistor heats up the variable resistance drops to near zero due to heating from the introduction of electrical current and thus the high current electrical device is drawing all available current.

In a second aspect, power electronics are used to cool a resistance. A programmable controller/triac (triode for alternating current) or SCR (silicon-controlled rectifier) circuit, over the course of a few seconds, can adjust the amount of current that is supplied to the AC motor.

Aspects of the present disclosure provide a temperature activated (thermistor) cooling fan. A plug-and-play, soft starter with a NEMA (National Electrical Manufacturers Association) standard plug and receptacle is described below.

A current sensor and micro-controller are utilized in conjunction with a bypass relay to aid in the "recovery" or cool down of soft start thermistors. Thus, aspects provide for a soft starter which can simply be added-on to existing power tools and single-phase motors. Most soft starters existing today use VFD's or variable frequency drives. These are geared toward larger 3 phase motors and allow adjustment of soft start and soft stop functions. Some tool manufacturers build soft starters into their tools. The most effective way of performing this is by adding a "start winding" to the electric motor.

High inrush current produced when equipment is turned on may result in damage to electrical devices, adjacent devices and the personnel operating the electrical device. A safe and cost-effective way to reduce inrush current is to use an inrush current limiter, which is a special type of negative temperature coefficient (NTC) thermistor.

Typically, an NTC thermistor's resistance drops logarithmically as its temperature increases when high current begins to flow through the NTC thermistor. An inrush current limiter is a component used to limit inrush current to avoid gradual damage to components and avoid blowing fuses or tripping circuit breakers. Negative temperature coefficient (NTC) thermistors and fixed resistors are often used to limit inrush current. NTC thermistors can be used as inrush-current limiting devices in power supply circuits when added in series with the circuit being protected. They present a higher resistance initially, which prevents large currents from flowing at turn-on. As current continues to flow, NTC thermistors heat up, allowing higher current flow during normal operation. NIT thermistors are usually much larger than measurement type thermistors and are purposely designed for power applications.

An NTC thermistor's resistance is low at high temperatures. When the circuit is closed, the thermistor's resistance limits the initial current. After some time, current flow heats the thermistor, and its resistance changes to a lower value, allowing current to flow uninterrupted. It is inherently impossible for 100% of supply voltage to appear on the protected circuit, as the thermistor must continue to dissipate power (i.e., producing heat) in order to maintain a low resistance. The resulting voltage drop from the operating resistance, and the power consumption of the thermistor must be considered.

Inrush current limiting thermistors are usually disk-shaped, with a radial lead on each side. NTC resistor power handling is proportional to its size. NTC resistors are rated according to their resistance at room temperature.

Typically, an NTC thermistor's resistance drops logarithmically as its temperature increases. The function of the NTC thermistor is to reduce the inrush current and then effectively remove itself from the circuit. The limiter blocks the incoming current spike by offering a relatively high resistance upon power on. Typical resistance ranges are from 0.25 ohm to 220 ohms, depending on the amount of protection desired. As current flows through to the NTC thermistor, the resistance drops to as low as 0.01 ohm, which functionally removes it from the circuit.

Fixed resistors are also widely used to limit inrush current. These are inherently less efficient, since the resistance never falls from the value required to limit the inrush current. Consequently, they are generally chosen for lower power circuitry, where the additional ongoing power waste is minor. Inrush limiting resistors are much cheaper than thermistors. They are found in most compact fluorescent lamps (e.g., light bulbs). They can be switched out of the circuit using a relay or MOSFET though, after inrush current is complete.

A typical application of inrush current limiters is in the input stage of non-power factor corrected switching supplies, to reduce the initial surge of current from the line input to the reservoir capacitor. The most popular application is the inrush protection of the AC current in switching power supplies (SPS). The primary reason for having surge current suppression in a SPS is to protect the diode bridge rectifier as the input or charging capacitor is initially charged. This capacitor draws significant current during the first half AC cycle and can subject the components in line with the capacitor to excessive current. The initial equivalent series resistance (ESR) of the capacitor provides very little protection for the diode bridge rectifier.

Typically, a thermistor is connected in series with a load. It is operationally desirable to limit the time in which the resistance of the thermistor is high. Thus, it is highly desirable to quickly cooldown the thermistor after the load has reached steady-state conditions.

With reference to FIG. 1 an inrush current limiting circuit in accordance with an aspect of the present disclosure is shown. Inrush current limiting circuit 100 is shown having a housing enclosure 102, discussed in more detail in FIG. 2, an exhaust port 104, an electrical input 106, an electrical output 108, one or more NTC or PTC thermistors 110, an axial cooling fan 112, a temperature switch 114 and a printed circuit board (PCB) 116.

In operation housing enclosure 102 can be made of most any material, such as a polymer. Housing enclosure 102 has PCB 116 mounted on an interior wall. PCB 116 would have temperature switch 114, thermistors 110 and cooling fan 112 all mounted on PCB 116. When electrical input 106, a male electrical receptacle is plugged into a wall outlet, electrical power would stand readily available until an electrical device was plugged into the electrical outlet 108 and powered on, thus completing the circuit and allowing electricity to flow. During the initial powering on of a high current electrical device, and discussed above, a large amount of current would flow through the thermistors 110. This large amount of current would quickly heat up the thermistors and thus start lowering their resistive value.

Once temperature switch 114 reached a set temperature, a signal would be sent to axial cooling fan 112 to power on and begin cooling the thermistors 110. This cooling of the thermistors would increase the resistance of the thermistors 110 and thus help in reducing the current delivered to the high current electrical device. The temperature could be preset in manufacturing and based upon the value of the thermistor 110. For example, if the thermistors lose half their resistance at 100-degree Fahrenheit, then the temperature switch 114 could be set to 100 degrees Fahrenheit to begin cooling the thermistors 110 and thus cooling the thermistors 110 which in turn increases the resistance and increases the current load, thus reducing current to the high current electrical device.

Figure 2:
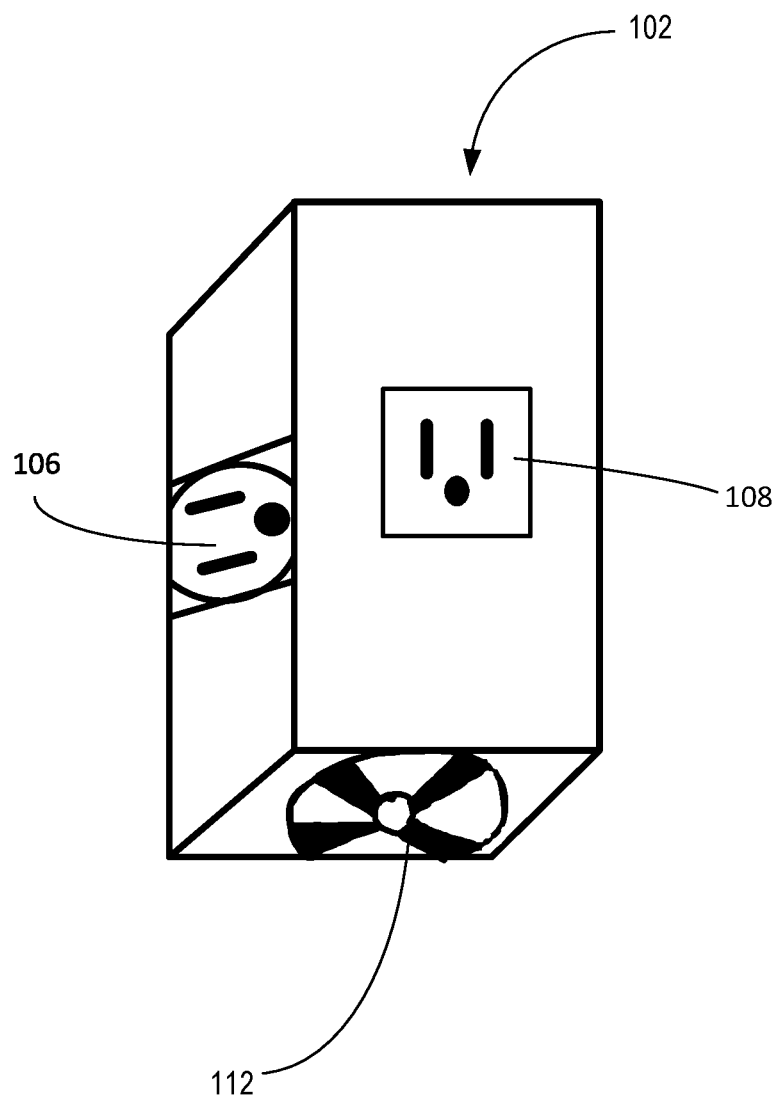
FIG. 2 is a pictorial representation of a housing enclosure in accordance with an exemplary aspect of the present disclosure.

With reference to FIG. 2, a pictorial representation of a housing enclosure in accordance with an aspect of the present disclosure is shown. Housing enclosure 102 is shown with outlet 108 which can accept the male electrical connector of a high current electrical device. Input 106 can be a male or female electrical connector. This would allow housing enclosure 102 to be used most anywhere within a location with the use of an extension between the wall outlet and the housing enclosure. However, it is preferable if the input 106 is a male connector to be plugged into most wall outlets or female connections of an extension cord. At the bottom of enclosure 102 is an air vent inlet for cooling fan 112 to bring in outside cool air in which to cool off the thermistors 110.

Figure 3:
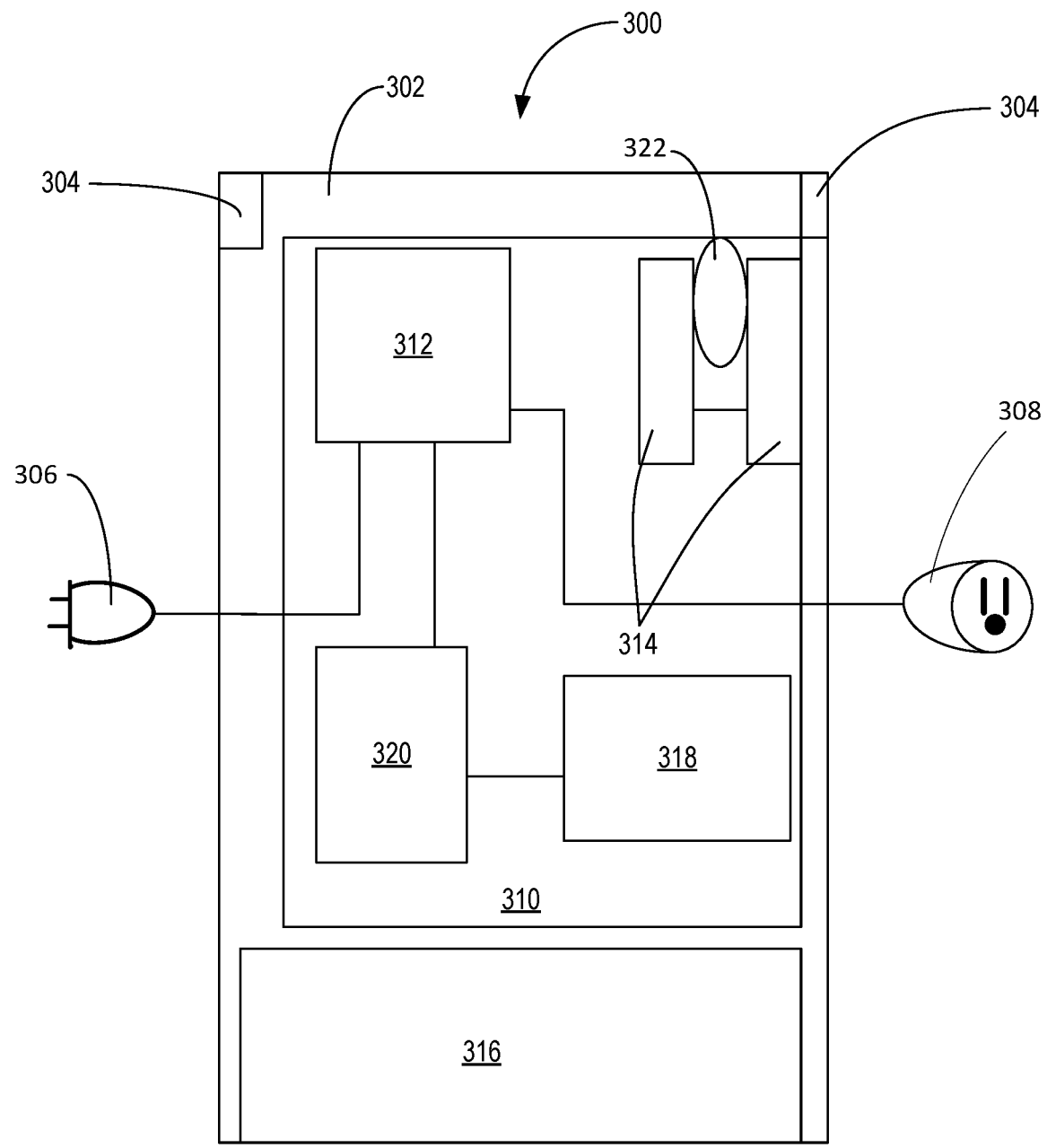
FIG. 3 is a pictorial representation of an inrush current limiting circuit in accordance with an exemplary aspect of the present disclosure.

With reference to FIG. 3, a pictorial representation of an inrush current limiting circuit in accordance with an aspect of the present disclosure is shown. Inrush current limiting circuit 300 has an enclosure 302, with exhaust vents 304, electrical input 306, and output 308, PCB 310, a bypass relay 312, thermistors 314, axial cooling fan 316, current sensor 318, microcontroller 320 and temperature sensor 322.

The inrush current limiting circuit 300 of FIG. 3, retains the thermistors 314, the axial cooling fan 316 and the temperature sensor 322, but in this aspect current sensor 318 acts to sense activation or powering on of the high current device coupled to outlet 308. Current sensor 318 sends a signal to the micro-controller 320 to start a timer. Further, micro-controller 320 triggers bypass relay 312 when the timer is up and the current sensor 318 indicates the current flowing to the high current device is within a normal range and the inrush current has subsided.

During the inrush current, the current flows through the thermistors 314. As they are heated up, the temperature sensor 322 would start the axial cooling fan 316 upon reaching a set temperature. Once current sensor 318 determines a steady state of current exists, bypass relay 312 bypasses the thermistors and routes the current directly to output 308.

Figure 4:
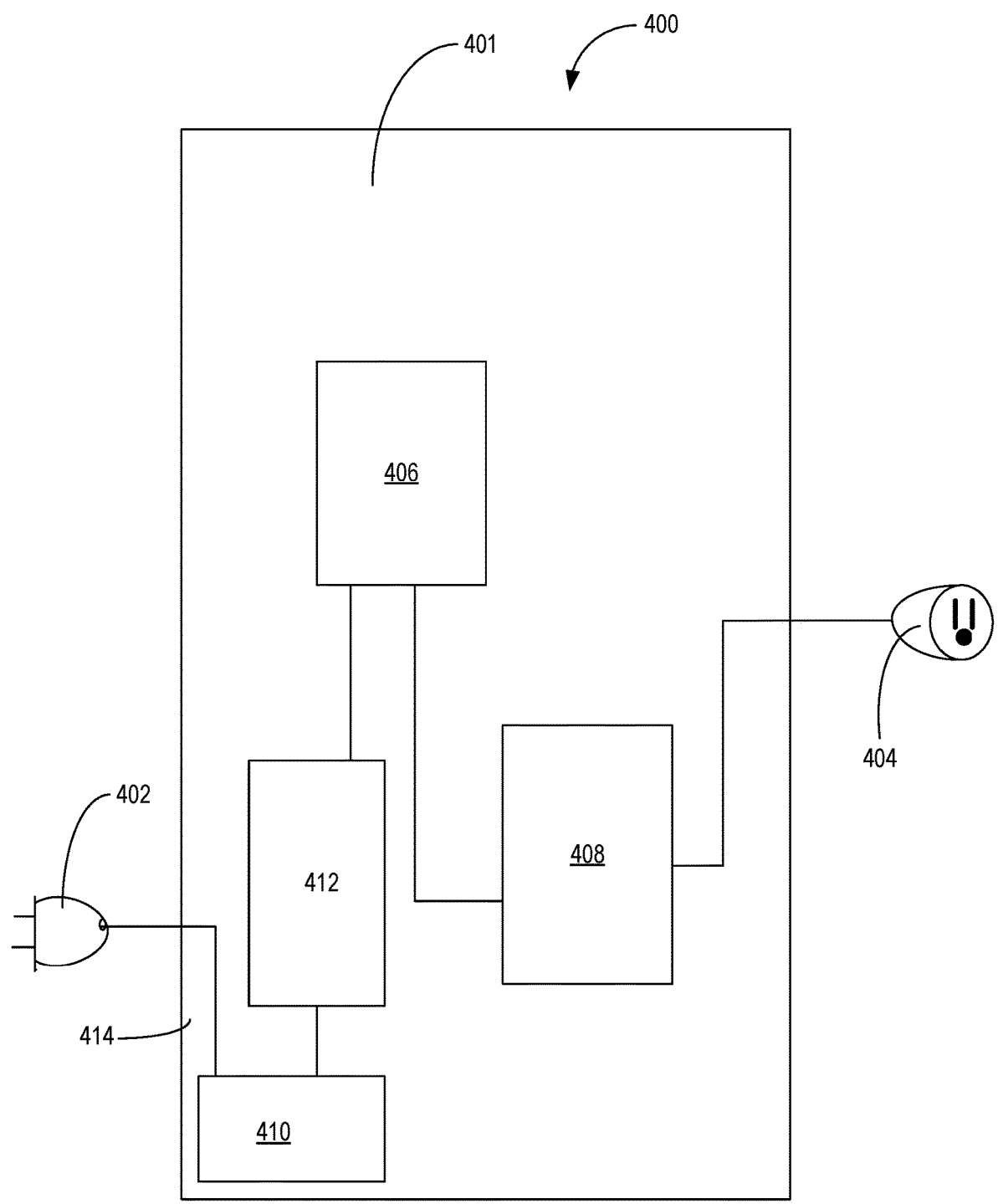
FIG. 4 is a pictorial representation of an inrush current limiting circuit in accordance with an exemplary aspect of the present disclosure.

With reference to FIG. 4, a pictorial representation of an inrush current limiting circuit in accordance with an aspect of the present disclosure is shown. The aspect of FIG. 4 does not require an axial cooling fan. The aspect still has a current limiting circuit 400 and a housing enclosure 401 having an electrical inlet 402 and outlet 404. Placed electrically in-between inlet 402 and outlet 404 is a current sensor 410, such as a hall effect current sensor, a zero-crossing detector 412, a microcontroller 406 and a Triac or SCR assembly 408.

In this aspect, current sensor 410 detects electric current in wire 414, and generates a signal proportional to the current. The generated signal could be analog voltage or current or even a digital output. Zero-crossing detector 412 is a voltage comparator, used to detect a sine waveform transition from positive and negative, coinciding when the incoming voltage crosses the zero-voltage condition.

The Triac SCR assembly 408 is used to reduce current in current-limiting circuit 400. Micro-controller 406 controls the triac (triode for alternating current) SCR (silicon-controlled rectifier) circuit 408, over the course of a few seconds and can adjust the amount of current supplied to a high current electrical device.

In operation the microcontroller 406 receives a sensed current input from current sensor 410. Further, zero-crossing detector 412 sends a signal to the microcontroller 406 notifying the microcontroller 406 which phase, positive or negative the incoming alternating current is currently in. Based upon the current sensed at current sensor 410, microcontroller 406 controls the firing angle (portion of sine wave allowed to be passed through Triac 408) of the Triac 408, reducing it to zero degrees (full power) over a few seconds. For example, according to at least one aspect, using the reference from a zero-crossing circuit, the microcontroller 406 will pulse the gate of the Triac 408 when it is to allow the current to pass. The microcontroller 406 pulses according to the firing angle (or portion of sine wave conducted) that is written in software code loaded onto and operating on the microcontroller 406. In at least on aspect, the soft starter sine wave software code will first apply a higher firing angle (which limits output voltage and therefore current), once a small predetermined current level is exceeded (sensed by the current sensor 410), the software program will gradually (over a 2 second period) reduce the firing angle to zero degrees, allowing full power from the Triac 408. In at least one configuration, software code operating microcontroller 406 can be programmed so a higher firing angle=lesser portion of sine wave (lower voltage), lower firing angle=greater portion of sine wave (more voltage), and zero degrees firing angle=full sine wave (full voltage/current).

A Triac (triode for alternating current) is a three terminal electronic component conducting current in either direction when triggered. Also referred to as a bidirectional triode thyristor or bilateral triode thyristor. A thyristor is analogous to a relay. A small voltage of induced current can control a much larger voltage and current. TRIACs are a subset of thyristors and are related to silicon-controlled rectifiers (SCRs). TRIACs differ from SCRs in they allow current flow in both directions, whereas an SCR can only conduct current in a single direction. Most TRIACs can be triggered by applying either a positive or negative voltage to the gate (an SCR requires a positive voltage). Once triggered, SCRs and TRIACs continue to conduct, even if the gate current ceases, until the main current drops below a certain level called the holding current.

TRIACs' bidirectionality makes them convenient switches for alternating-current (AC). In addition, applying a trigger at a controlled phase angle of the AC in the main circuit allows control of the average current flowing into a load (phase control).

Figure 5:
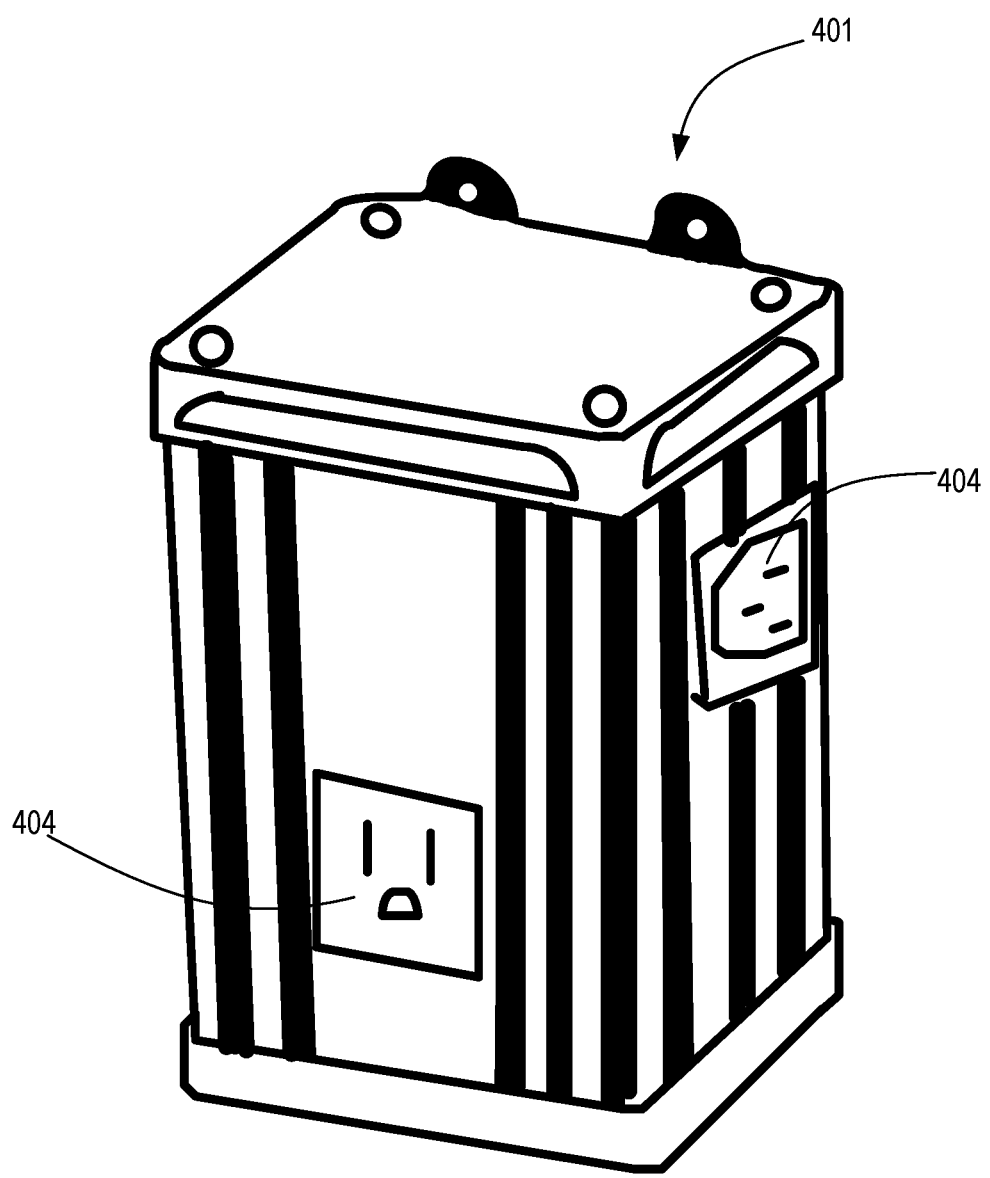
FIG. 5 is a pictorial representation of a housing enclosure in accordance with an exemplary aspect of the present disclosure.

With reference to FIG. 5, a pictorial representation of a housing enclosure in accordance with an aspect of the present disclosure is shown. Housing enclosure 401 is like housing enclosure 102 except there is no need for an air vent 112 as there is no cooling fan required for current limiting circuit 400. An electrical inlet 404 and an electrical outlet 406 are shown on housing 401.

Figure 6:
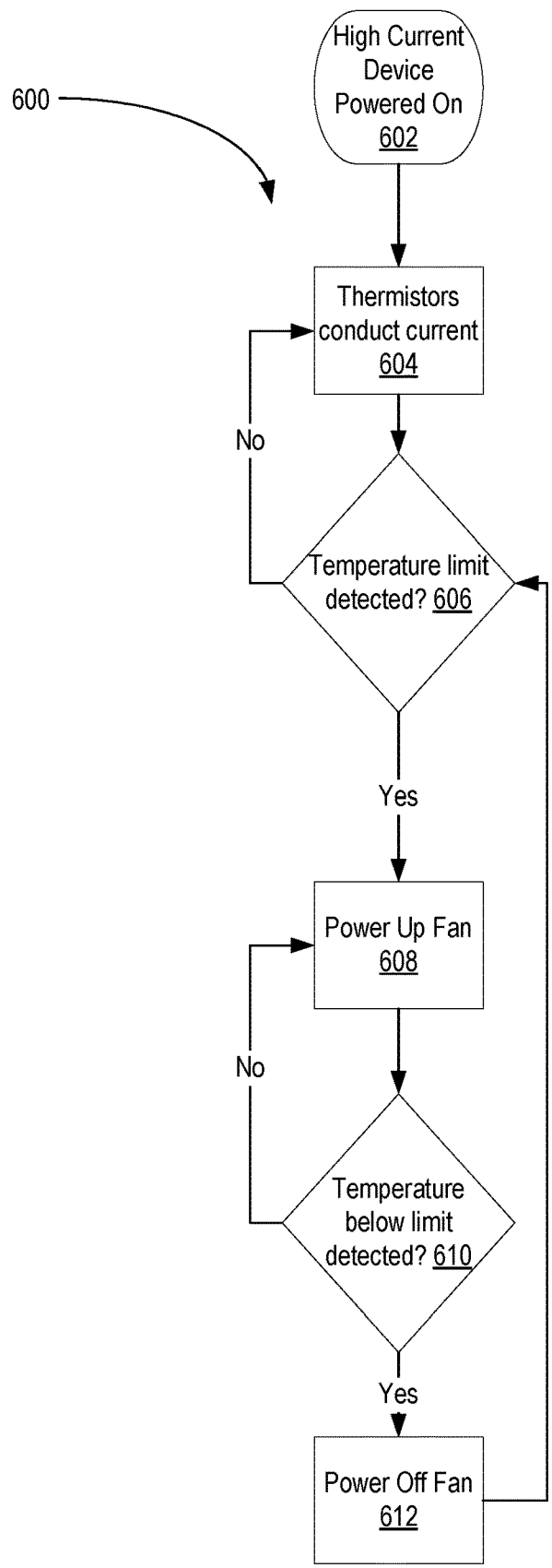
FIG. 6 is a flowchart diagram of an inrush current limiting circuit operation in accordance with an exemplary aspect of the present disclosure.

With reference to FIG. 6, a flowchart diagram of an inrush current-limiting circuit operation in accordance with an aspect of the present disclosure is shown. Inrush current limiting program 600, can begin at state 602 when a high current electrical device is either turned on or is sensed to be turned on by an inrush current circuit, such as 400, 300 or 100. At state 604, thermistors begin to heat from current flowing through. At state 606, temperature sensor 114 or 322 senses the heat generated by thermistors 314 or 110 has exceeded a present limit thus significantly reducing the resistance of thermistors 314 or 110. At state 608, axial fan 316 or 112 is powered on to cool thermistors 110 or 314. At state 610, if the temperature of thermistors 110 or 314 fall below the present limit, the axial fan 316 or 112 can be powered off at state 612. Inrush current limiting program 600 then returns to state 606 to determine the temperature of the thermistors 114 or 322. Or in some respects, the thermistors are bypassed once the current has stabilized, such as in inrush current limiting circuit 300.

Figure 7A:
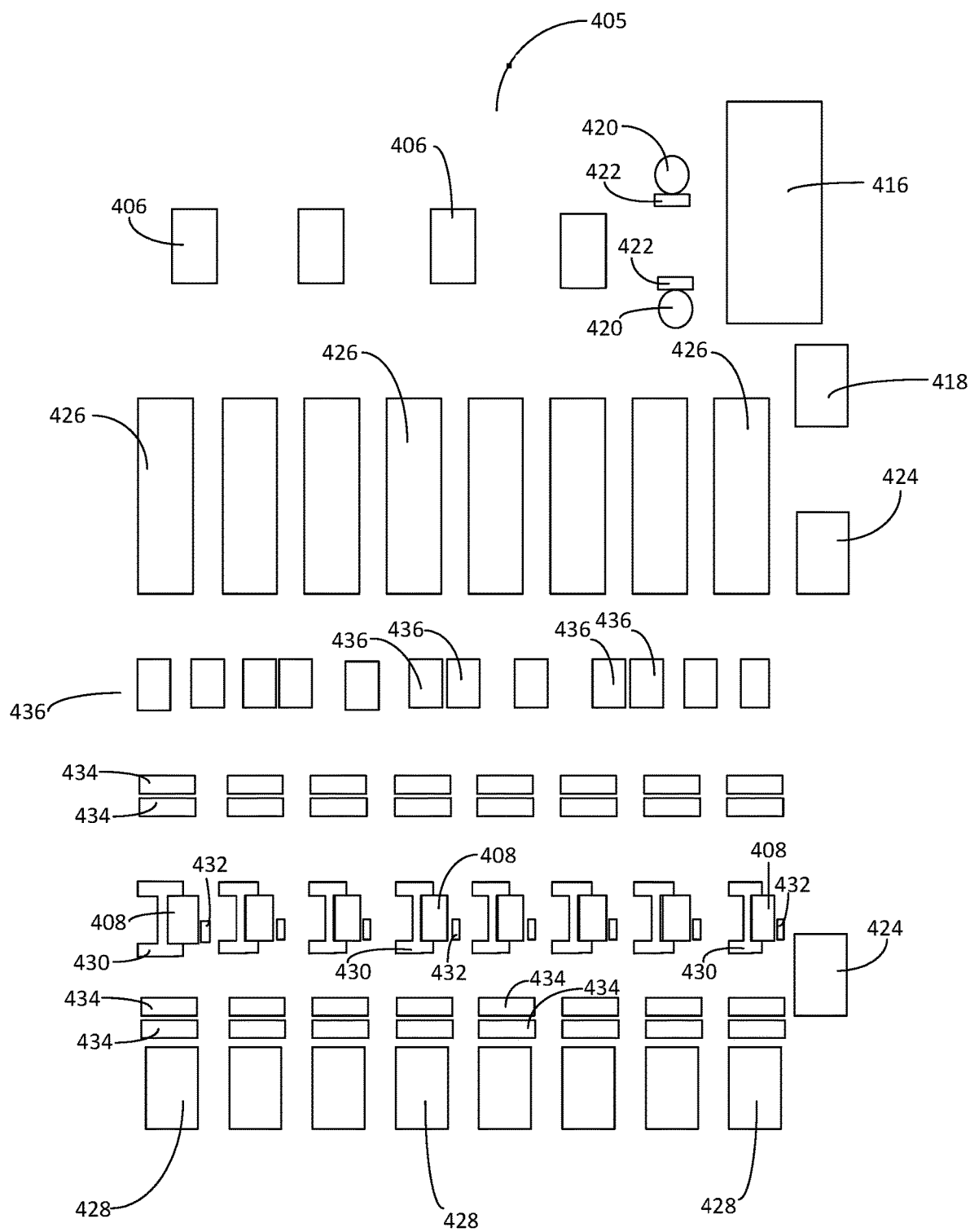
FIG. 7A-C are pictorial representations of an inrush current limiting circuit in accordance with another exemplary aspect of the present disclosure.
Figure 7B:
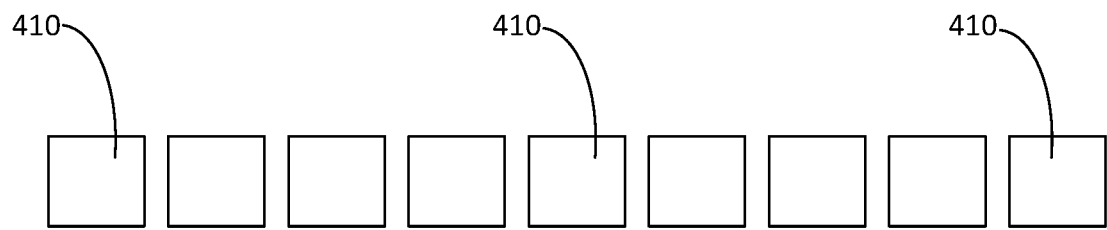

With reference to the figures using power control functions for limiting current, what is disclosed generally is, a soft start subpanel 454 with hardwired current limiting circuit(s) 400 for providing dedicated electrical service to one or more hardwired outlets 404 within a structure 452 using a hardwired 450 electrical system and main electrical service panel 450 wired to a power source or electrical service 448. The structure 452 can be any structure type with hardwired 450 electrical service 448, such as a plant, manufacturing shop, and home or mobile unit such as a motorhome, semi-trailer, and modular unit. In one aspect, electrical service 448, such as a 100-amp service line, can be run from a main electrical service panel 450 to a soft start subpanel 454 within a hardwired electrical system of a structure 452. The soft start subpanel 454 can be configured with any number of soft start circuits 400, such as a one or more, two or more, three or more, four or more, and up to 8 or more soft start circuits 400 electrically connected and powered by electrical service 448, such as a 100-amp service, from a main electrical service panel 450 within a structure 452. Thus, a number of identical soft start circuits 400 on a circuit board 405 of the subpanel 454 can be powered from a single electrical input 448 from a main breaker box or main electrical service panel 450 for providing power to a number of dedicated, soft start outlets 404 hardwired 450 within a structure 452. The subpanel 454 can include a circuit board 405 configured with each of the soft start circuits 400. An exemplary circuit board 405 is shown in FIG. 7A-B, with FIG. 7A showing one side and FIG. 7B showing the opposite side. A dedicated, soft start electrical outlet 404 can be hardwired 450 to an output terminal lug 428 of the subpanel 454. Each output terminal lug 428 of the subpanel 454 can be hardwired to a separate, dedicated soft start outlet 404 within a structure 452. Thus, a structure 452 having a main breaker box/electrical service panel 450 with electrical service 440, such as a 100-amp service, can include one or more soft start subpanels 454 for providing dedicated, hardwired 450 electrical service to one or more dedicated, soft start outlets 404 within the structure 452.

The circuit board 405 providing current limiting circuits 400 can an include one or more input terminal lugs 418, such as for example, connecting to 120V or 240V service, and a corresponding neutral bar 424. The circuit board can include one or more transformers 416 for stepping the voltage down to a lower voltage. In one aspect, the transformer 416 can be 10:1 transformer for reducing 120V to 12V output for powering electronics on the circuit board 405 which are part of the current limiting circuit 400.

The circuit board 405 can be configured within a housing enclosure 401, such as a subpanel box. Current limiting circuits 400 can be housed within the subpanel box, such as on one or more printed circuit boards (PCBs) 405, having an electrical inlet 402 and one or more or a plurality of output terminal lugs 428 hardwired 450 to outlets 404. Placed electrically in-between inlet 402 and output terminal lugs 428 one or more or a plurality of current sensors 410, such as a hall effect current sensor, zero-crossing detectors 412 that can include, for example, a diode bridge rectifier 456 and opto-coupler 458, microcontrollers 406 and Triacs or SCR assemblies 408, circuit breakers 426, transformer(s) 416, capacitors 420, 422, 432, resistors 434, heat sinks 430, opto-isolators 436, and other PCT electronical components.

The current sensor 410 detects electric current in hardwire 450 and generates a signal proportional to the current. The generated signal could be analog voltage or current or even a digital output. Zero-crossing detector 412 is a voltage comparator, used to detect a sine waveform transition from positive and negative, coinciding when the incoming voltage crosses the zero-voltage condition.

Figure 8:
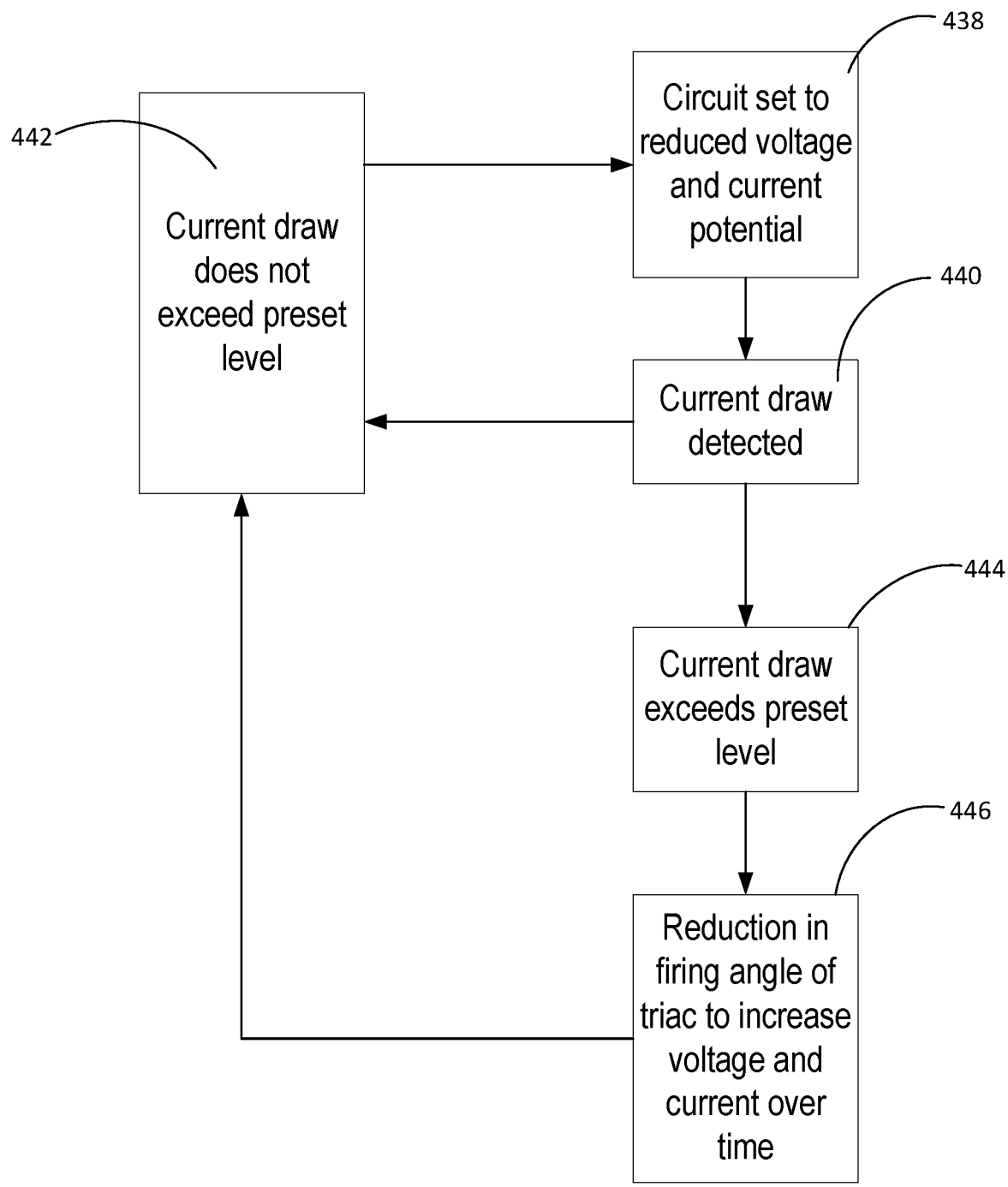
FIG. 8 is a flowchart diagram of an inrush current limiting operation in accordance with another exemplary aspect of the present disclosure.

The Triac 408 is used to reduce current in current-limiting circuit 400. Micro-controller 406 controls the Triac (triode for alternating current) SCR (silicon-controlled rectifier) circuit 408, over the course of a few seconds, as best shown in FIG. 8, and can adjust the amount of current supplied to a high current electrical device plugged into hardwired 450 outlets 404.

In operation microcontrollers 406 receives a sensed current input from current sensors 410. Further, zero-crossing detectors 412 send a signal to the microcontrollers 406 notifying the microcontrollers 406 which phase, positive or negative the incoming alternating current is currently in. Based upon the current sensed at current sensors 410, microcontrollers 406 control the firing angle (portion of sine wave allowed to be passed through Triacs 408) of the Triacs 408, reducing it to zero degrees (full power) over a few seconds. For example, according to at least one aspect, using the reference from a zero-crossing circuit, the microcontroller 406 will pulse the gate of the Triac 408 when it is to allow the current to pass. The microcontroller 406 pulses according to the firing angle (or portion of sine wave conducted) that is written in software code loaded onto and operating on the microcontroller 406. In at least on aspect, the soft starter sine wave software code will first apply a higher firing angle (which limits output voltage and therefore current) as shown in Step 438 of FIG. 8. If the current detected does not exceed a preset or predetermined current level as shown in Step 442 of FIG. 8 the software loaded on microcontrollers 406 maintains a higher firing angle for Triacs 408 so circuit is set to reduced voltage and current potential (Step 438). Once a small predetermined current level is exceeded (sensed by the current sensor 410) as shown in Step 440 of FIG. 8, the software program will gradually (over a 2 second period) reduce the firing angle to zero degrees (Step 446), allowing full power from the Triac 408. In at least one configuration, software code operating microcontrollers 406 can be programmed so a higher firing angle=lesser portion of sine wave (lower voltage), lower firing angle=greater portion of sine wave (more voltage), and zero degrees firing angle=full sine wave (full voltage/current). When the current returns to a level that does not exceed a preset or predetermined current level (Step 442), such as when a universal or induction motor connected to an outlet 404 is turned off, the software code operating microcontrollers 406 set the Triac to a relatively high degree firing angle so circuit is set to reduced voltage and current potential (Step 438).

During operation, transformer(s) 416 reduces the voltage for powering the software code operating microcontrollers 406 with, for example, 12V instead of 120V. The circuit can include one or more heat sinks 430 for dissipating heat from the Triacs 408 and other circuitry components. The circuit includes one or more circuit breakers 426, such as 25 A circuit breaker for a 20 A circuit, to maintain, for example, a safety rating of 115% of the amperage rating for a motor connected to an outlet 404. Other amperage circuit breakers can be used based on the need at outlet 404. Opto-isolator(s) 436 isolate, for example, using light, the Triac(s) 408 input from other circuitry components of each current limiting circuit 400.

Each outlet 404 has a dedicated current limiting circuit 400 within subpanel 454. This allows the subpanel 454 and circuit board 405 to be configured for a multitude of uses. In one aspect, current can be limited in one outlet 404 and not limited in another outlet 404 using the current limiting circuits and software controlled microcontrollers 406. For example, a saw motor can be connected to hardwired outlet 404 and a dust vacuum can be connected to another hardwired 450 outlet 404. The power limiting circuit can increase voltage and current over time to the saw motor and at the same time power on the dust vacuum. In another configuration, software code for the microcontroller 406 for the circuit 440 connected to the duct vacuum can be rewritten to soft start outlet 404 connected to the dust vacuum. Thus, the subpanel 454 can be configured with a number of soft start circuits 400 each hardwired 450 to a dedicated outlet 404 for controlling voltage and current over time, if desired, to any electrically powered device plugged into hardwired 450 outlet(s) 404.

The subpanel 454 can be configured to for handling split phase (240V) service. Two Triacs 408 are configured for controlling each phase of 120V. One Triac 408, for example, could control power and current to a saw motor and the other Triac 408, for example, could control power and current to a dust vacuum. The current limiting circuit(s) 400 can be configured within a subpanel 454 as shown in the figures or in a plug-n-play (module) housing enclosure 401 with pigtails connections 106, 108 for connecting to input and output terminal lugs of the enclosure, such as shown in FIG. 5. The housing enclosure 401 can subpanel box 454. The housing enclosure 401 can be a portable unit that is not hardwired. Configurations can range from single phase configuration having one, two or more outlets 404. Commercial units can be range from a single phase configuration having four, eight or more outlets 404. Units can be configured for split phase power, such as 240V, split phase power having two 120V hot legs with two separate bus bars for feeding half the output terminal lugs 428 with one hot leg and the other output terminal lugs 428 with the other hot leg. The unit could be configured with a power limiting circuit for 240V soft start outlet 404 at 20A or a 240V soft start outlet 404 at 30A depending on need. On one aspect, a unit could be configured to split the two incoming phases of power and run each phase through separate 120V power limiting circuits 400 at, for example, 15 A, per circuit. A unit can be configured to separate and control two phases of power independently, such as where power is provided to operate a saw motor and vacuum motor independently and using on one or both phases of power the power limiting functionality of the present disclosure. The concepts of the present disclosure provide for the combination of 120V and 240V power using soft start circuits 400, where instead of a having a 120V input and a neutral, configurations also include having two 120V hot leg inputs that are out of phase along with a neutral input. One phase could be wired to, for example, four soft start circuits 400 and the other phase wired to four additional soft start circuits 400. By way of further example, 120V power could be connected to any one of output terminal lugs 428 or to an electrical outlet 404, whether a pigtail or hardwired; similarly, 240V could be used by connected each of the 120V hot legs to each of the 120V output terminal lugs 428, outlets 404 or pigtail outlet (power cord) 404. In another example, eight output terminal lugs 428 or outlets 404 can be provided by configuring four outputs/outlets as 240V soft start outputs/outlets, eights outputs/outlets as 120V soft start outputs/outlets, or four 120V soft start outputs/outlets and two 240V soft start outlets. In another example, the one or more soft start outputs/outlets can be a regular, non-soft start output/outlet in combination with one or more soft start output(s)/outlet(s), based on need or preference.

The configurations of the present disclosure offer significant safety features and functionality to keep users safe from shock and electrocution, while also protecting electrical power consuming devices from being harmed. For example, the circuits 400 are set to reduced voltage and current potential and any immediate current draw is very limited, thus resulting in very little chance for shock more than a tingle and/or electrocution. In another example, if during reduction of the firing angle of the Triac 408 thus resulting in increased voltage and current over time, if an outlet/output wire of the circuit were accidentally cut it would trip circuit breaker(s) 426.

Figure 7C:
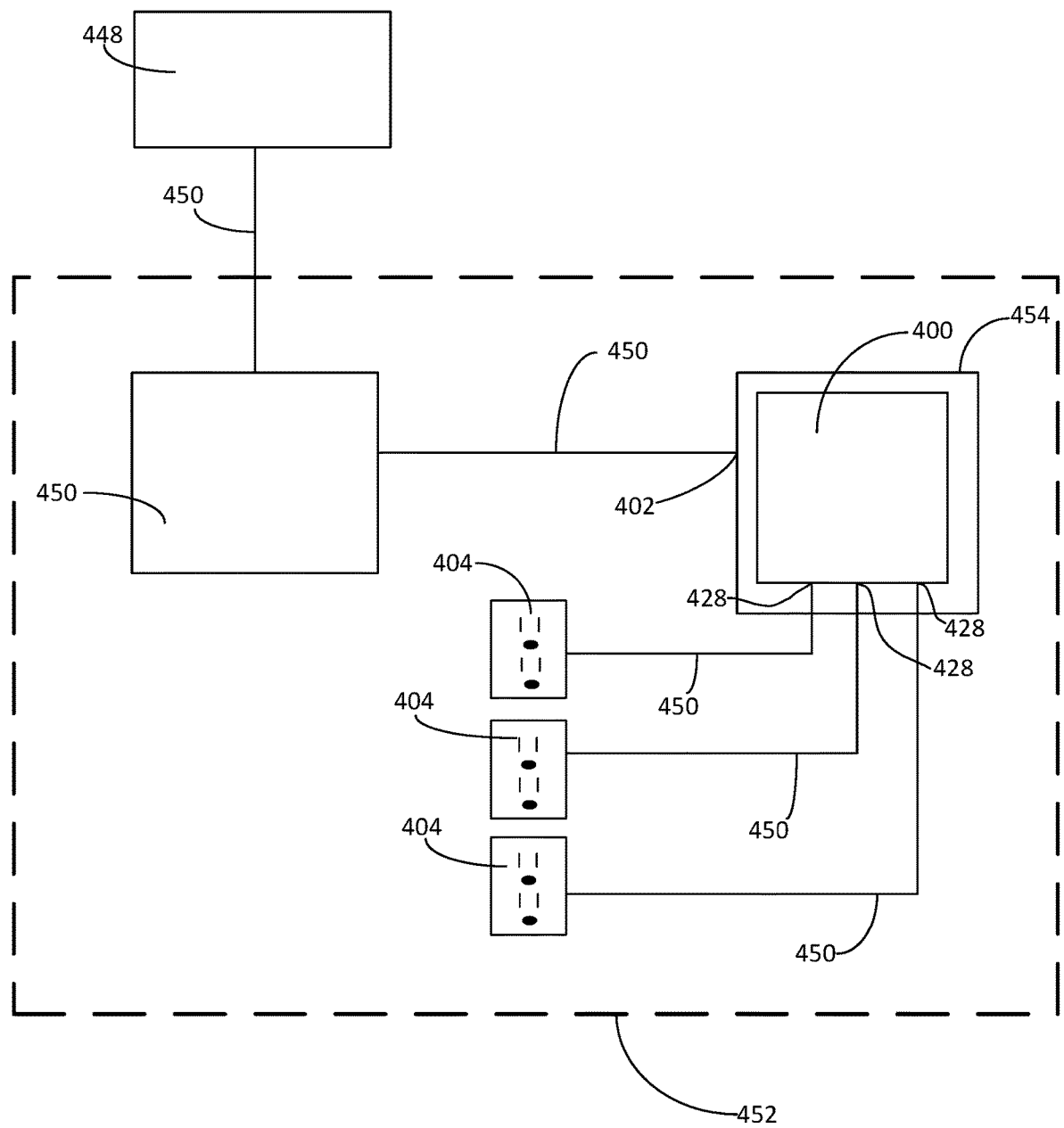
Figure 9A:
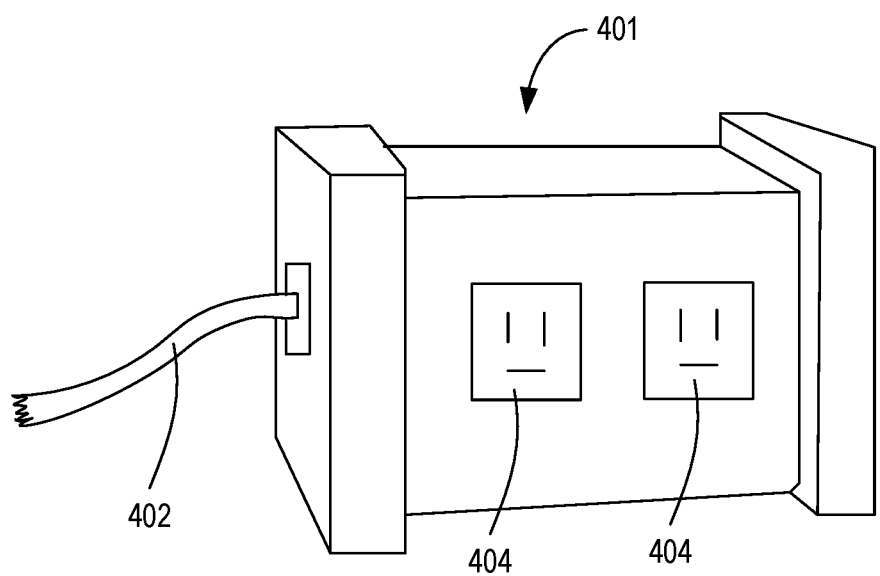
FIG. 9A-C are pictorial representations of inrush current limiting enclosures in accordance with an exemplary aspect of the present disclosure.
Figure 9B:
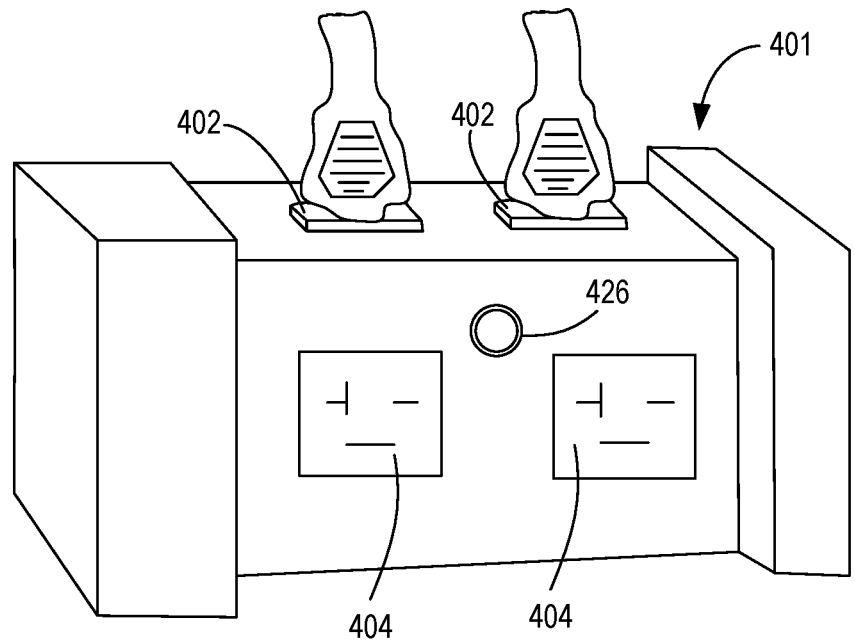
Figure 9C:
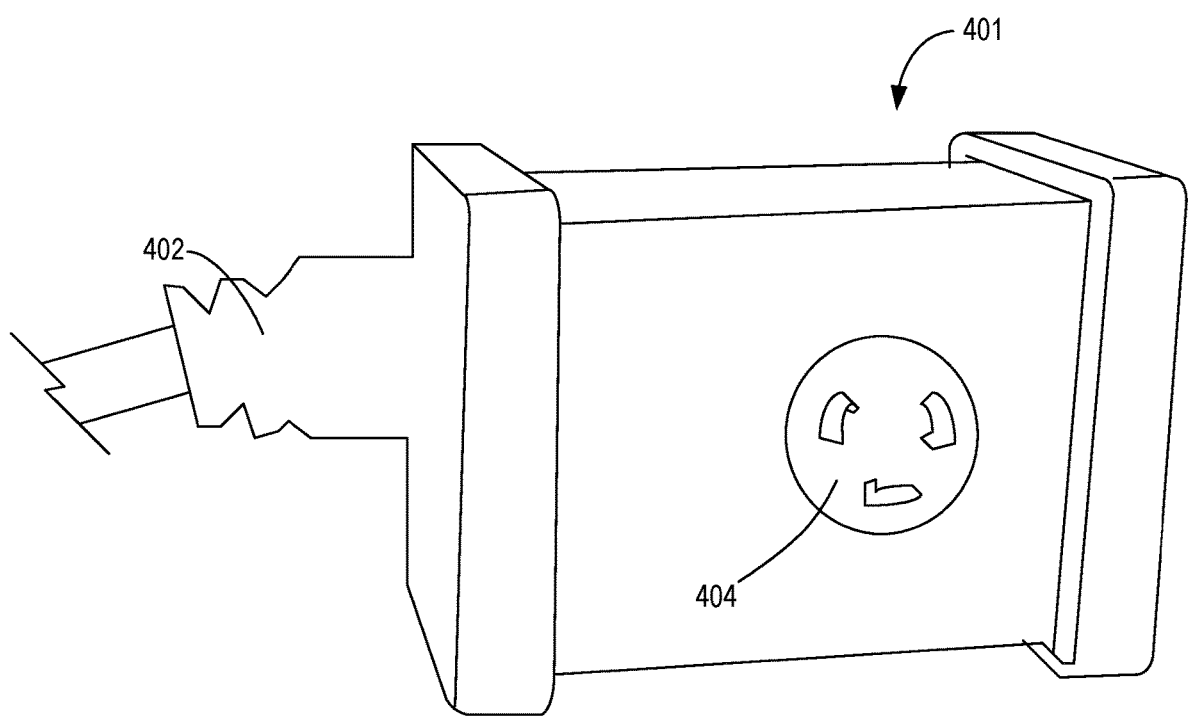

The power limiting circuit(s) 400 of the present disclosure can be implemented within a housing enclosure 401 of varying shape, size, proportion, input voltage, output voltage, amperage, etc., as best shown in FIGS. 9A-C. Written description is not limited to the drawing(s) for which it describes. For example, the description for aspects of the current limiting circuit 400 described relative to use in a subpanel 454 within a hardwired structure as shown in FIGS. 7A-C can be implemented into a housing enclosure 401 that is portable as shown in the other Figures, such as FIGS. 4, 5 and 9.

The disclosure is not to be limited to the aspects described herein. In particular, the disclosure contemplates numerous variations in inrush current limiting. The foregoing description has been presented for purposes of illustration and description. It is not intended to be an exhaustive list or limit any of the disclosure to the precise forms disclosed. It is contemplated that other alternatives or exemplary aspects are considered included in the invention. The description is merely examples of aspects, processes or methods of the invention. It is understood that any other modifications, substitutions, and/or additions can be made, which are within the intended spirit and scope of the invention.

What is claimed is:

1. An inrush current limiting circuit, comprising:
a printed circuit board;
an electrical input and an electrical output connected to the printed circuit board;
a current limiting circuit connected between the electrical input and the electrical output, the current limiting circuit for increasing voltage and current over time from the electrical input to the electrical output by operation of a current sensor and a microcontroller;
an electrical enclosure having the electrical input and the electrical output, wherein the electrical enclosure houses the current limiting circuit and the electrical input is configured to connect to an electrical service and the electrical output is configured to provide connection to the electrical service by the current limiting circuit.

2. The circuit of claim 1, wherein the electrical input comprises an electrical service input connector.

3. The circuit of claim 1, wherein the electrical output comprises an electrical service output connector.

4. The circuit of claim 1, wherein the current limiting circuit comprises a triode for alternating current.

5. The circuit of claim 1, wherein the current sensor comprises a hall effect current sensor.

6. The circuit of claim 1, wherein the current limiting circuit comprises a zero-crossing detector for sending a signal to the microcontroller for the phase of incoming alternating current from the electrical service.

7. The circuit of claim 1, wherein the electrical input comprises a pigtail connected electrical connector.

8. The circuit of claim 1, wherein the electrical output comprises a pigtail connected electrical connector.

9. A portable inrush current limiting circuit and housing, comprising:
a portable electrical current limiting circuit component housing;
an electrical input connected to the housing, the electrical input configured for connection to an electrical service;
an electrical output connected to the housing, the electrical output configured for connection to an electrical consuming device or circuit;
a current limiting circuit comprising a hardwire connection between the electrical input and the electrical output, the current limiting circuit comprising at least one current limiting component for increasing voltage and current over time from the electrical input to the electrical output by operation of a current sensor and a microcontroller.

10. The circuit and housing of claim 9, wherein the electrical input comprises an electrical input connector disposed on the housing.

11. The circuit and housing of claim 9 wherein the electrical input comprises an electrical input connector hardwired to and extending from the housing.

12. The circuit and housing of claim 9, wherein the electrical output comprises an electrical output connector disposed on the housing.

13. The circuit and housing of claim 9, wherein the current limiting circuit comprises a triode for alternating current.

14. The circuit and housing of claim 9, wherein the current sensor comprises a hall effect current sensor.

15. The circuit and housing of claim 9, wherein the current limiting circuit comprises a zero-crossing detector for sending a signal to the microcontroller for the phase of incoming alternating current from the electrical service.

16. A method for increasing voltage and current over time from an electrical input to an electrical output by operation of a current limiting circuit, the method comprising:
providing a portable electrical current limiting circuit component housing, an electrical input configured for connection to an electrical service and an electrical output configured for connection to an electrical consuming device or circuit, and a current limiting circuit having at least one microcontroller, current sensor, and current limiting component connected between the electrical input and the electrical output;
detecting current draw with the current sensor;
increasing voltage and current over time from the electrical input to the electrical output with the current limiting component by operation of a current sensor and a microcontroller of the current limiting circuit;
housing the current limiting circuit within the portable electrical current limiting circuit component housing for connecting the electrical input to the electrical service and the electrical output to the electrical consuming device or circuit.

17. The method of claim 16, further comprising:
detecting current draw with the current sensor.

18. The method of claim 16, further comprising:
determining a phase of incoming alternating current from the electrical service with a zero-crossing detector.

19. The method of claim 16, further comprising:
operating the microcontroller with software code loaded onto the microcontroller for controlling current differently to two or more of the electrical outputs.

20. The method of claim 16, further comprising:
receiving a startup command at the current limiting circuit from the electrical consuming device or circuit connected to the housing via the electrical input.

\* \* \* \* \*